United States Patent
Bojer et al.

(10) Patent No.: US 9,748,916 B2
(45) Date of Patent: Aug. 29, 2017

(54) ADAPTIVE FILTER RESPONSE SYSTEMS AND METHODS

(71) Applicant: Wispry, Inc., Irvine, CA (US)

(72) Inventors: Jorgen Bojer, Vadum (DK); Peter Dam Madsen, Aalborg (DK); Arthur S. Morris, III, Raleigh, NC (US)

(73) Assignee: WISPRY, INC., Irvine, CA (US)

( * ) Notice: Subject to any disclaimer, the term of this patent is extended or adjusted under 35 U.S.C. 154(b) by 48 days.

(21) Appl. No.: 14/446,270

(22) Filed: Jul. 29, 2014

(65) Prior Publication Data

US 2015/0131492 A1 May 14, 2015

Related U.S. Application Data

(60) Provisional application No. 61/859,621, filed on Jul. 29, 2013.

(51) Int. Cl.
*H03H 7/01* (2006.01)
*H03H 7/46* (2006.01)
(Continued)

(52) U.S. Cl.
CPC ........ *H03H 7/0138* (2013.01); *H03H 7/0115* (2013.01); *H03H 7/0153* (2013.01);
(Continued)

(58) Field of Classification Search
CPC ...... H03H 7/463; H03H 7/12; H03H 2210/00; H03H 2210/01; H03H 7/0115; H03H 7/0153; H03H 7/0138; H03H 7/175
(Continued)

(56) References Cited

U.S. PATENT DOCUMENTS

| 5,541,558 A * | 7/1996 | Weber ............... H03H 7/1775 333/174 |
| 6,411,178 B1 * | 6/2002 | Matsumura ......... H03H 7/0115 333/134 |

(Continued)

FOREIGN PATENT DOCUMENTS

| CN | 102 460 826 A | 5/2012 |
| CN | 102593837 A | 7/2012 |

(Continued)

OTHER PUBLICATIONS

International Search Report for Application No. PCT/US2014/048712 dated Jul. 29, 2014.

(Continued)

*Primary Examiner* — Stephen E Jones
*Assistant Examiner* — Rakesh Patel
(74) *Attorney, Agent, or Firm* — Jenkins, Wilson, Taylor & Hunt, P.A.

(57) ABSTRACT

The present subject matter relates to systems, devices, and methods for adaptively tuning antenna elements and/or associated filter elements to support multiple frequency bands. For example, a tunable filter having an input node and an output node can be selectively tunable to define one or more pass bands associated with one or more first signal bands and one or more reject bands associated with one or more second signal bands. The tunable filter can be configured to pass signals having frequencies within the first signal bands between the input node and the output node and to block signals having frequencies within the second signal bands. Furthermore, the tunable filter can be configured to selectively tune the pass bands to have a minimum pass band insertion loss at any of a variety of frequencies, including frequencies that are greater than and less than frequencies within the reject bands.

20 Claims, 8 Drawing Sheets

(51) Int. Cl.
*H03H 7/12* (2006.01)
*H04L 5/14* (2006.01)

(52) U.S. Cl.
CPC .............. *H03H 7/12* (2013.01); *H03H 7/463* (2013.01); *H04L 5/1461* (2013.01); *H03H 7/175* (2013.01); *H03H 7/1758* (2013.01); *H03H 7/1766* (2013.01); *H03H 2210/00* (2013.01); *H03H 2210/01* (2013.01)

(58) Field of Classification Search
USPC .............. 333/17.1, 126, 129, 174, 175, 132
See application file for complete search history.

(56) References Cited

U.S. PATENT DOCUMENTS

| | | | |
|---|---|---|---|
| 6,686,817 B2 | 2/2004 | Zhu et al. | |
| 9,035,727 B2 | 5/2015 | Han et al. | |
| 9,559,659 B2 | 1/2017 | Bøjer | |
| 2002/0079885 A1* | 6/2002 | Estep | G01R 1/04 324/762.03 |
| 2002/0186099 A1 | 12/2002 | Sengupta et al. | |
| 2004/0127178 A1* | 7/2004 | Kuffner | H01P 1/15 455/133 |
| 2004/0130414 A1 | 7/2004 | Marquardt et al. | |
| 2006/0145782 A1* | 7/2006 | Liu | H03H 7/463 333/132 |
| 2007/0247261 A1 | 10/2007 | Tsuzuki et al. | |
| 2009/0286569 A1* | 11/2009 | Rousu | H01P 1/213 455/553.1 |
| 2011/0169589 A1 | 7/2011 | Franzon et al. | |
| 2011/0267119 A1* | 11/2011 | Koechlin | H03H 7/19 327/158 |
| 2012/0112853 A1 | 5/2012 | Hikino et al. | |
| 2013/0162374 A1 | 6/2013 | Tamiazzo et al. | |

FOREIGN PATENT DOCUMENTS

| | | |
|---|---|---|
| CN | 202737827 U | 2/2013 |
| WO | WO 2012/025946 A1 | 3/2012 |
| WO | WO-2015/017452 | 2/2015 |

OTHER PUBLICATIONS

Communication of European Publication Application No. 14832808 dated May 11, 2016.
Chinese Office Action for Application No. 2014800273045 dated Mar. 28, 2017.
Chinese Office Action for Application No. 201400432978 dated May 4, 2017.

* cited by examiner

ADAPTIVE FILTER RESPONSE SYSTEMS AND METHODS

PRIORITY CLAIM

The present application claims the benefit of U.S. Provisional Patent Application No. 61/859,621, filed Jul. 29, 2013, the disclosure of which is incorporated herein by reference in its entirety.

TECHNICAL FIELD

The subject matter disclosed herein relates generally to filters and antenna elements configured for use in transmitting and receiving radio frequency signals. More particularly, the subject matter disclosed herein relates to filters and antenna elements that are tunable to support multiple frequency bands.

BACKGROUND

In modern handheld devices for cellular communication systems (e.g. 3GPP) there is a desire to support multiple frequency bands (e.g 3GPP LTE bands 1, 2, 3, 5, 7, 8, and 13). Further in this regard, one particular area of interest in radio communication has been how to deal with transmitter and receiver duplexing, with transmitter and receiver operating at a fixed or variable frequency separation. For such frequency division duplex, an issue known as duplex self-interference can present a problem in the design of such systems. The problem arises from the high power of the transmitter challenging the linearity of the receiver that can be set up to have a high gain to deal with low power reception levels.

For small handheld devices, duplex operation has typically been achieved using fixed frequency filters known as duplex filters (e.g., dielectric coaxial resonator filters, SAW, BAW, FBAR) that are switched among operating frequencies (e.g., for multiband operation) using semiconductor switches due to technology and size constraints. These fixed frequency filters and antennas exhibit particular limitations in that, for each band of operation, a new set of hardware must be introduced (e.g., adding antenna resonator coupling element, filters, and switches when adding band support). As a result, tunable systems would be beneficial in reducing the amount of hardware required to operate at a range of frequencies, but it is difficult to make a tunable system that is also cost effective and small while at the same time meeting system requirements (e.g., 3GPP standards). In addition, although a majority of cellular frequency bands (e.g., 3GPP standard LTE FDD bands 1 to 25) have reception frequencies above transmission frequencies (i.e., "positive" duplex spacing), there are operating bands (e.g., LTE bands 13, 14, 20, and 24) that have the reverse order (i.e., "negative" duplex spacing) such that the reception frequencies are below the transmission frequencies. As a result, designing systems that are able to operate in either kind of spacing presents further impediments to reducing the number of hardware components required.

Accordingly, it would be desirable for there to be a solution to change the characteristics of the filter to accommodate both positive and negative duplex spacing instead of switching between different hardware or filters, which can thereby allow filter resonators to be reused for both positive and negative duplex spacing. In addition, it would be further desirable for a solution to bring down the size of a tunable solution, to make it cost efficient, and at the same time, with proper design, to solve the issue of removing unwanted interference, such as from a transmitter in the wireless communication terminal.

SUMMARY

In accordance with this disclosure, systems, devices, and methods for adaptively tuning antenna elements and/or associated filter elements to support multiple frequency bands are provided. In one aspect, an adaptive filter is provided in which a tunable filter having an input node and an output node is selectively tunable to define one or more pass bands associated with one or more first signal bands and one or more reject bands associated with one or more second signal bands. In this aspect, the tunable filter is configured to pass signals having frequencies within the one or more first signal bands between the input node and the output node, and the tunable filter is configured to block signals having frequencies within the one or more second signal bands. Furthermore, the tunable filter is configured to selectively tune the one or more pass bands to have a minimum pass band insertion loss at any of a variety of frequencies, including frequencies that are greater than and less than frequencies within the one or more reject bands.

In another aspect, an adaptive filter response system for a wireless radio antenna is provided. The adaptive filter response system can comprise one or more antennas in communication with a first signal path and a second signal path and one or more first tunable filters in communication with the first signal path. The one or more first tunable filters can be selectively tunable to define one or more first pass bands associated with one or more first signal bands and one or more first reject bands associated with one or more second signal bands, wherein the one or more first tunable filters is configured to pass signals having frequencies within the one or more first signal bands between the one or more antennas and the first signal path, and wherein the one or more first tunable filters is configured to block signals having frequencies within the one or more second signal bands. In addition, the one or more first tunable filters is configured to selectively tune the frequencies passed by the one or more first pass bands to any of a variety of frequencies, including frequencies that are greater than and less than frequencies within the one or more first reject bands.

In yet another aspect, method for tuning an adaptive filter response system is provided. The method can comprise connecting a tunable filter between an input node and an output node, defining one or more pass bands associated with one or more first signal bands and one or more reject bands associated with one or more second signal bands, and selectively tuning the one or more pass bands to have a minimum pass band insertion loss at any of a variety of frequencies, including frequencies that are greater than and less than frequencies within the one or more reject bands. In this way, signals having frequencies within the one or more first signal bands are passed between the input node and the output node, and signals having frequencies within the one or more second signal bands are blocked.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

The present subject matter provides wireless frequency division duplex systems, devices, and methods that adapt filter responses to radio communication requirement. In this regard, in one aspect, the present subject matter provides a programmable filter that can adapt its filter characteristics to both positive and negative receive-to-transmit duplex spacings. As used herein, the term "filter" should here be understood widely as any hardware that generates a frequency-selective frequency response and can discriminate between receive- and transmit-frequency response (e.g., greater than about 8 dB).

Figure 1:
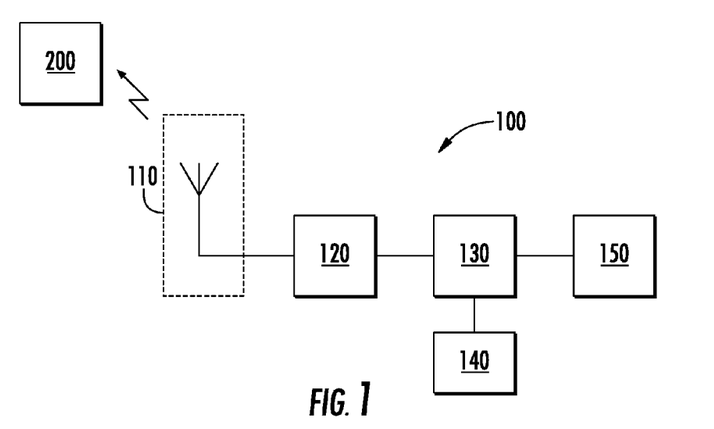
FIG. 1 is a block diagram of an adaptive filter response system for a wireless radio antenna according to an embodiment of the present subject matter.

For example, as illustrated in FIG. 1, an antenna duplex system, generally designated 100, can include an antenna element 110, a signal transfer element 120, a tunable filter 130, and a signal processing chain 150 connected in series. In this arrangement, tunable filter 130 can be configured for tuning the signal path frequency response between antenna element 110 and signal processing chain 150.

Antenna element 110 provides electromagnetic coupling of transmission or receive signal with a remote wireless communication unit either through direct coupling (i.e., a self-radiating antenna) or through coupling to another metallic surface (e.g., terminal ground chassis). It can contain one or more signal path input/output connections and one or more connection points for load tuning. Additionally, it can contain a matching circuit that optionally can be tunable. In any configuration, antenna element 110 can be configured for wireless communication with a remote wireless communication unit 200. For instance, remote wireless communication unit 200 can be a cellular basestation (e.g., 3GPP BTS, NB, or eNB), although those having skill in the art will recognize that remote wireless communication unit 200 can be any transponding unit using a fixed location antenna (i.e., a base) to serve one or more users or devices within an area or another mobile device in a mesh or similar network.

In communication with antenna element 110, signal transfer element 120 can include any of a variety of components that provide signal connections between antenna element 110 and tunable filter 130. Specifically, for example, signal transfer block can comprise one or more of a fixed frequency filter (e.g., a harmonic filter), an amplifier configured for amplifying levels between input and outputs, an electromagnetic coupling path (inductive or capacitive), a circuit for maximizing signal bandwidth, a conductive connection between inputs and outputs (e.g., short or transmission line type), or a combination thereof including control as required.

Tunable filter 130 can be an element that provides a frequency-selective filtering response between its input and output terminals according to the setting of a control unit 140 to which it can be connected. For example, tunable filter 130 can be configured to provide tunable band reject characteristics such that the primary reject frequency or frequencies can be selectively moved (e.g., movable notch for suppressing duplex self-interferer). Alternatively or in addition, tunable filter 130 can be configured to provide tunable pass band characteristics such that the pass band frequency can be moved relative to a reject band frequency. Specifically, in some embodiments, the tuning of the pass band characteristics can allow the primary pass band in one mode to be above the primary reject band frequency and in another mode allowing the primary pass band to be below the primary reject band frequency.

Regarding the control of the operating of tunable filter 130, control unit 140 can have a digital control interface with a latch register and a decoding and connection circuit capable of reading latch register information and applying this information to change the impedance of the variable elements of tunable filter 130. For example, such a control interface can include the use of a serial bus (e.g., SPI, RFFE, I2C) or programmable registers that, through semiconductor devices (e.g., transistors, gates, ADC's), control the impedance values of elements within tunable filter 130.

Figure 2:
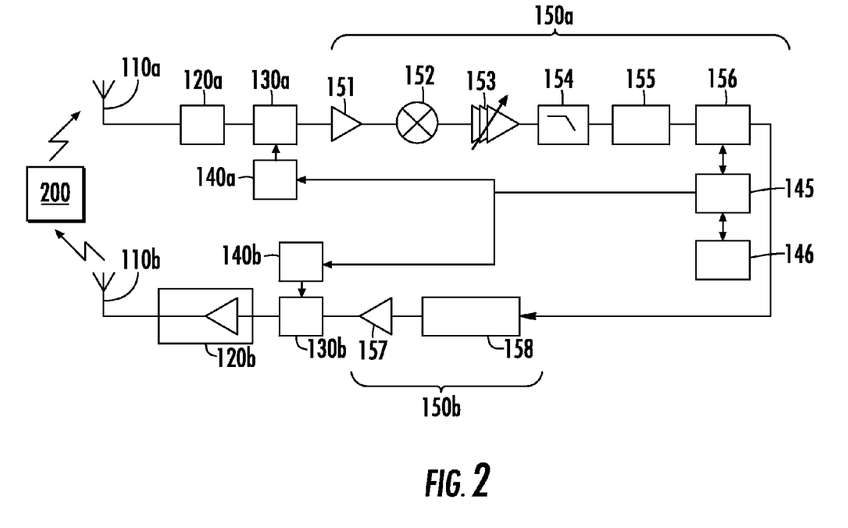
FIG. 2 is a more detailed block diagram of an adaptive filter response system for a wireless radio antenna according to an embodiment of the present subject matter.

Signal processing chain 150 is the input to the signal path to a unit that either further process the receive signal or the output to the signal path that process the transmission signal. As shown in FIG. 2, for example, antenna duplex system 100 can comprise two separate signal paths—one for receiving signals from remote wireless communication unit 200 and a second for transmitting signals to remote wireless communication unit 200. Further in this regard, those having skill in the art will recognize that one or more additional signal paths can be also provided as needed (e.g., to improve link quality, reliability, or throughput between the transmitter and receiver).

Referring to the particular exemplary configuration shown in FIG. 2, antenna duplex system 100 can comprise a first antenna element 110a in communication with a first signal transfer element 120a, a first tunable filter 130a, and a first signal processing chain 150a. In this configuration, this first signal path can serve as a receive signal path, and first signal processing chain 150a can normally comprise one or more of a low-noise amplifier (LNA) 151, a frequency-selection down conversion mixer 152, a variable-gain amplifier (VGA) 153, a system of signal selection filtering 154, an analog-to-digital converter (ADC) system 155, and a digital processing system 156 (e.g., DSP).

In addition, antenna duplex system 100 can comprise a second antenna element 110b in communication with a second signal transfer element 120b, a second tunable filter 130b, and a second signal processing chain 150b. This second signal path can serve as a transmit signal path, and second signal processing chain 150b can normally comprise a pre-drive amplifier 157 and a modulator 158, which can itself comprise a voltage-controlled oscillator (VCO), a phase-locked loop (PLL), one or more mixers, and digital processing logic.

To coordinate the operation of these separate signal paths, a single master control unit 145 can be provided in communication with both of first control unit 140a and second control unit 140b to control the communication protocols to and from the remote wireless communication unit 200 (i.e., by adjusting the tuning states of first and second tunable filters 130a and 130b). In addition, a multimedia controller or applications processor 146 can control the user operating system with graphical interface, user applications, or the like. In some embodiments, digital processing system 156, master control unit 145, and multimedia controller 146 can have shared hardware and processor(s).

Regardless of the particular configuration, antenna duplex system 100 can be operable not only to support multiple operating bands, but it can support bands having both positive duplex spacings and negative duplex spacings with the same filter. In this regard, any of a variety of methods by which antenna duplex system 100 is tuned to a desired operating configuration (e.g., performed as an algorithm running in master control unit 145) can be performed. First, for example, while searching for signal power, antenna duplex system 100 can look up a scan frequency. The reject band of first tunable filter 130a (i.e., in the receive signal path) can be moved away from the PLL scan frequency, and the pass filter band can be programmed to align with the PLL scan frequency. A scan can be performed at the scan frequency, and a next scan frequency can be looked up. If the loss at first tunable filter 130a at the scan frequency is too high, the reject band and pass band can be adjusted again as needed.

In this way, where antenna duplex system 100 has no downlink protocol link or broadcast information decoded, the frequency response of antenna duplex system 100 can be set according to the channel, frequency, or frequency band being scanned for power (e.g., searching for high power broadcast channels). This information about channel or frequency can be taken either from the layered UE protocol stack (e.g., 3GPP channel numbers) or from somewhere in the processing chain that performs translation of channel number to PLL setting. Accordingly, the frequency response can be set according to the physical frequency channel assigned for receive or transmit.

Alternatively, if a downlink to remote wireless communication unit 200 info is already established, then the receive band frequency can be looked up, and first tunable filter 130a can be tuned to move its reject band away from the receive band frequency (or alternatively to the transmit band frequency). The pass band of first tunable filter 130 can be programmed to align with the receive band frequency, and a test of signal reception can be performed. In this way, antenna duplex system 100 can respond, based on UE downlink protocol stack information, to commands giving by remote wireless communication unit 200 so as to set up the frequency response of antenna duplex system 100 according the band assigned for receive or transmit or according to the physical frequency channel assigned for receive or transmit. In yet a further alternative, when operating in a FDD duplex mode, the channel and band information can be received from remote wireless communication unit 200.

In any configuration, the "sign" of the duplex spacing can be calculated (or looked up). In situations where duplex spacing is "negative" (e.g., bands 13, 14, 20, 24), the pass band of first tunable filter 130 can be set to be below the transmit band frequency. Otherwise, the pass band can be set to be above the transmit band frequency. In the transmit signal path, the reject band of second tunable filter 130b can be set to the receive band frequency (or as close to the reception band as the transmit band insertion loss allows). Again, if the duplex spacing is "negative," the pass band of second tunable filter 130b can be set to be above the receive band frequency. Otherwise, it can be set to be below the receive band frequency.

For finite Q components and particularly for LC circuits with minimized circuit complexity and insertion loss, the spacing between desired rejection and pass bands will be near enough to each other that the edges of the rejection and pass bands may be in the filter frequency response transition region between the reject notch and low insertion regions of the filter, In this case, a tradeoff in tuning setting can be made between the achieved rejection at the edge of the rejection band and the achieved insertion loss at the edge of the passband. It may be that the reject band of first tunable filter 130 can be set to the transmit band frequency, but if not, it can be set as close to the transmit band as the resulting reception band insertion loss specification allows.

Figure 3A:
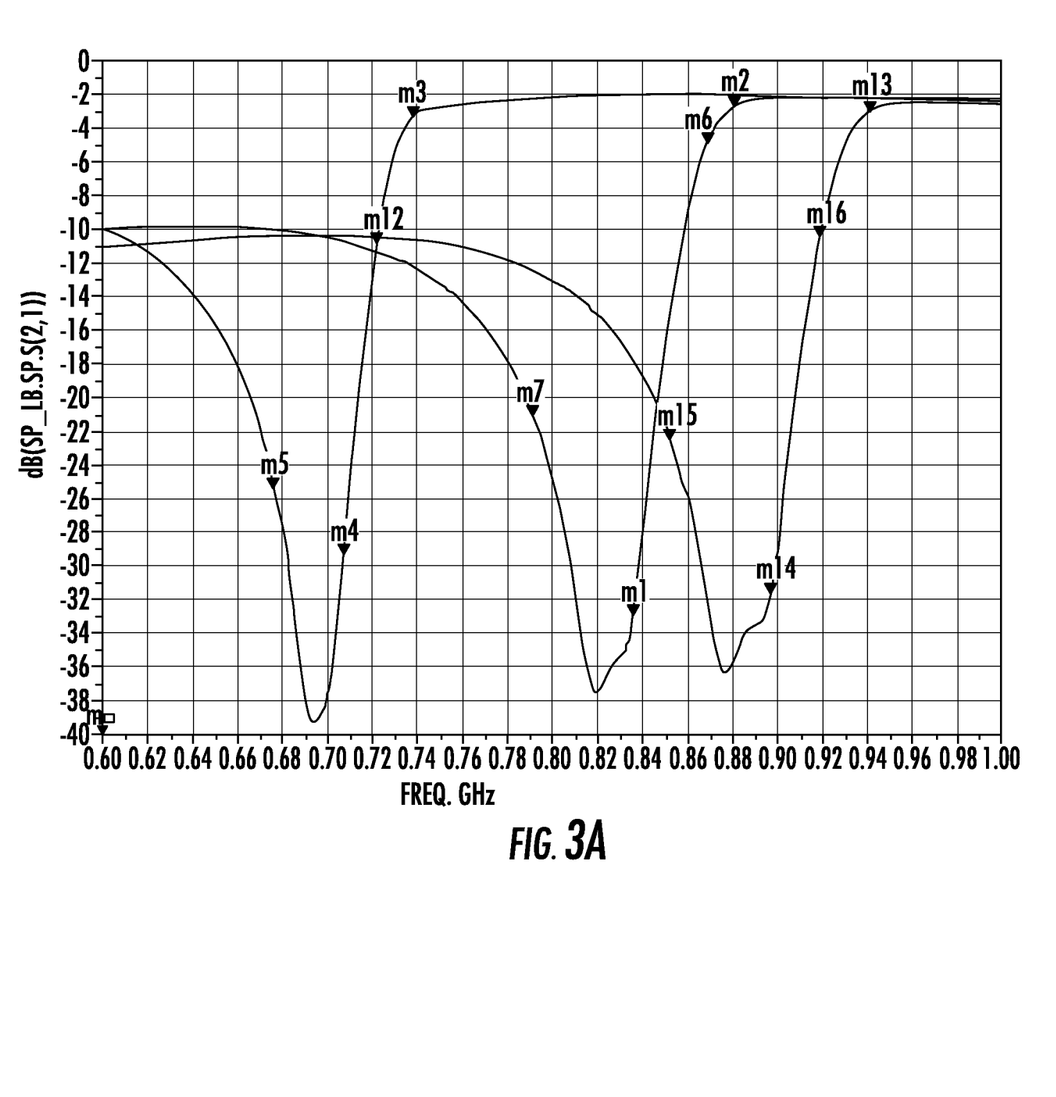
FIG. 3A is a graph showing an example of tunable receive band filter responses for "positive" duplex spacings in 3GPP LTE Bands 12, 5, and 8.
Figure 3B:
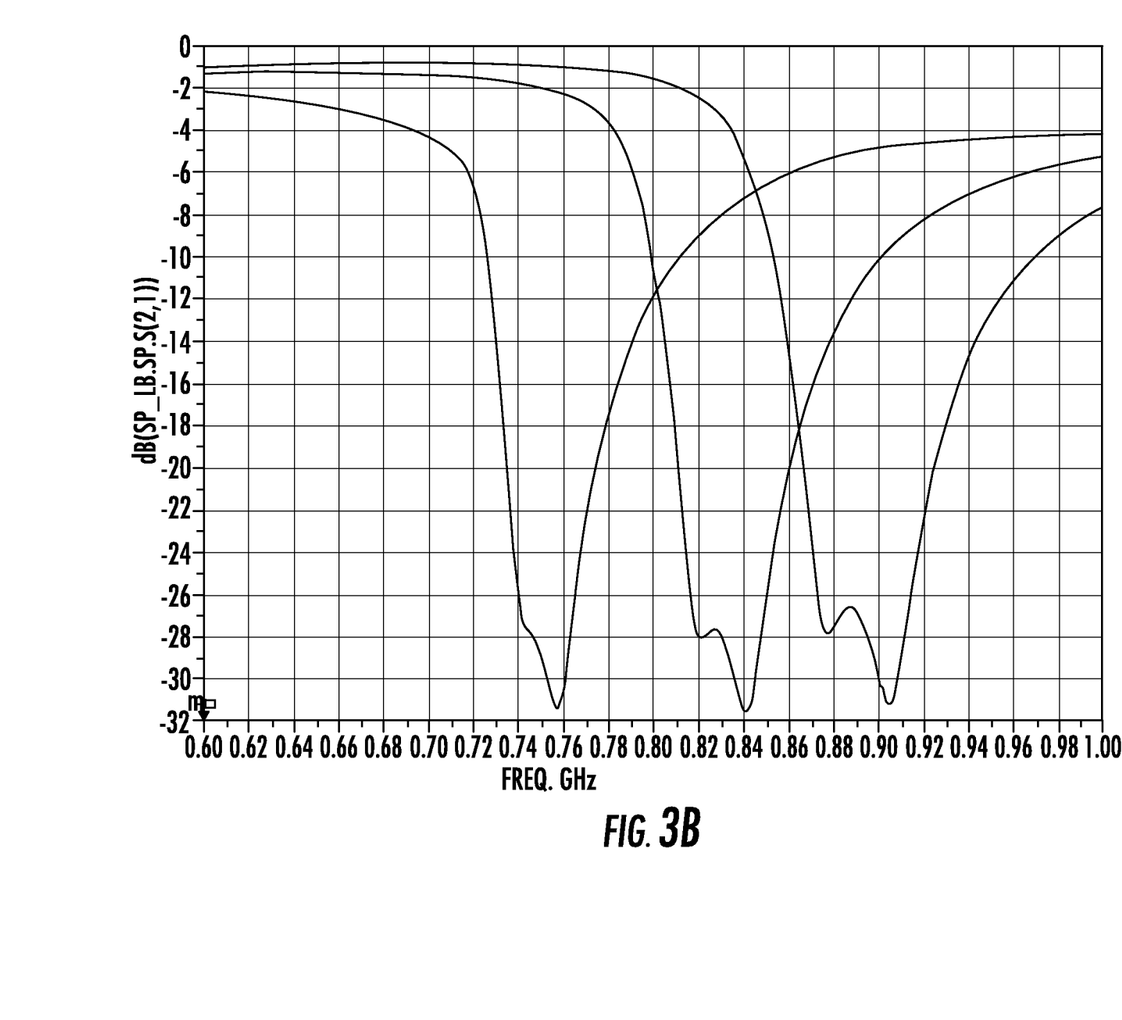
FIG. 3B is a graph showing an example of tunable receive band filter responses for "negative" duplex spacings.

Thus, to achieve these complex modes of tuning, the function of the one or more of tunable filter 130 can be to define tunable reject band characteristics and tunable pass band characteristics. Specifically, tunable filter 130 can be configured to be tunable such that a minimum pass band insertion loss can be programmed to be at either of a higher frequency side of the reject band when in a first duplexing mode or a lower frequency side of the reject band when in a second duplexing mode. To put this functionality in context, for example, where tunable filter 130 is incorporated into a receive signal path, it can be tunable such that a pass band is provided at frequencies above the reject band (i.e., "positive" duplex spacing, such as is shown in FIG. 3A) or at frequencies below the reject band (i.e., "negative" duplex spacing, such as is shown in FIG. 3B). Specifically, tunable filter 130 can be configured to have a total path band loss of less than 7 dB and a reject band attenuation of more than 18 dB at corresponding duplex frequencies. (i.e., if the filter is a receive filter, it can have pass band loss of less than 7 dB at the receive frequency and have attenuation at the transmit frequency of more than 18 dB)

Figure 3C:
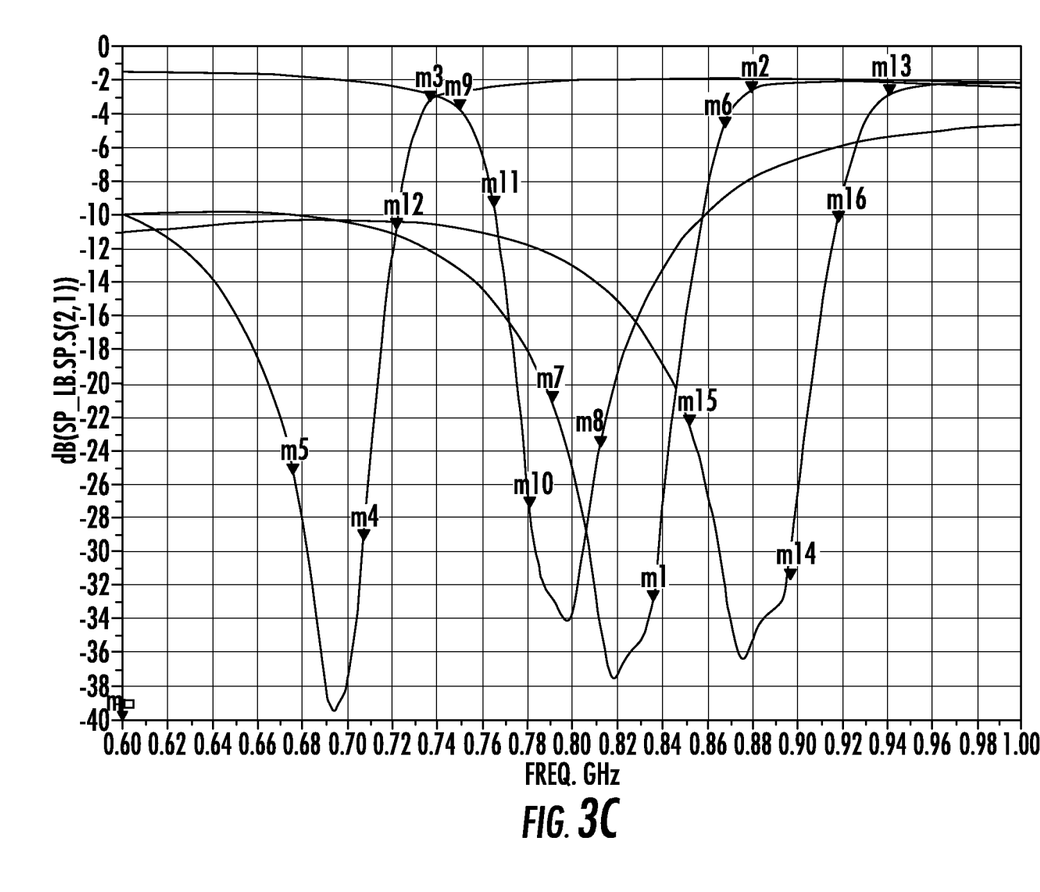
FIG. 3C is a graph showing an example of tunable receive band filter responses for both "positive" (LTE bands 5, 8, 12) and "negative" (LTE band 13) duplex spacings.
Figure 4A:
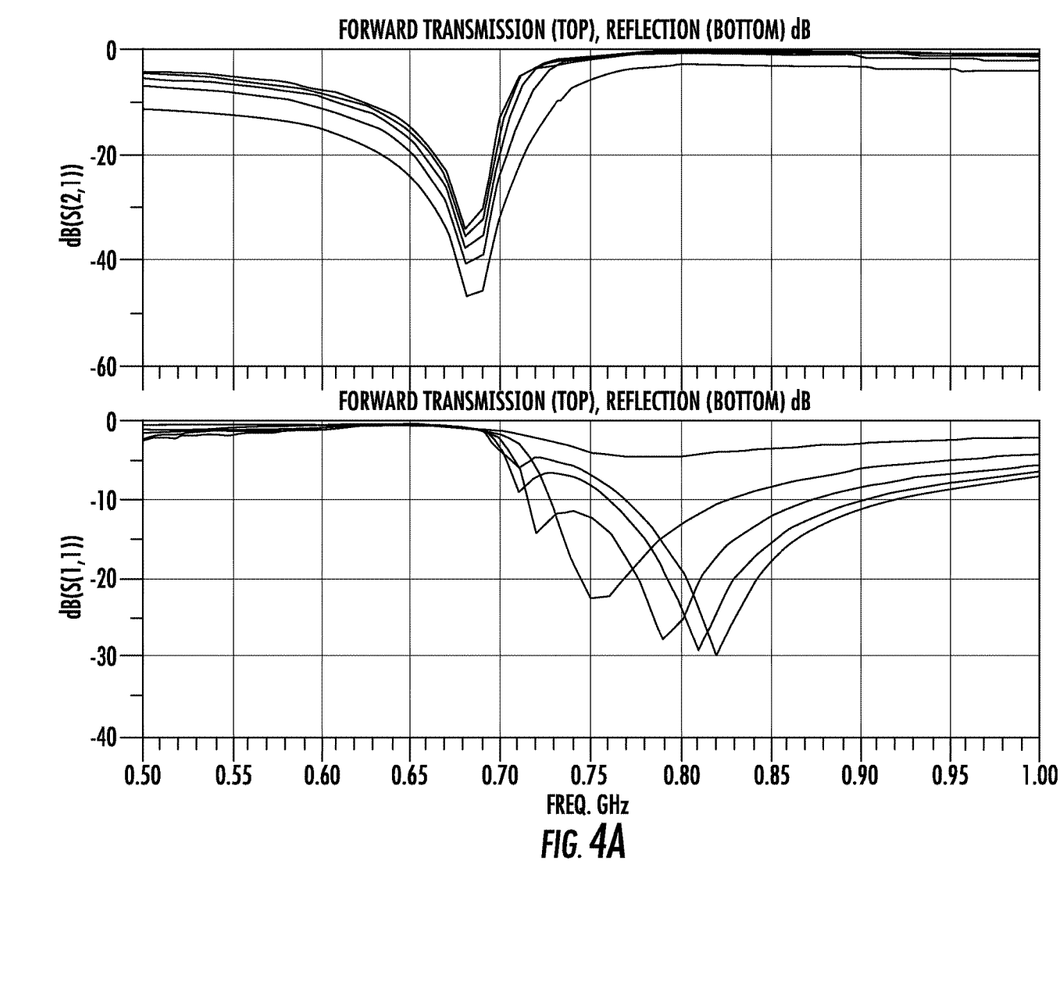
FIG. 4A is a graph showing an example of pass band tuning for a fixed notch frequency setting according to an embodiment of the present subject matter.
Figure 4B:
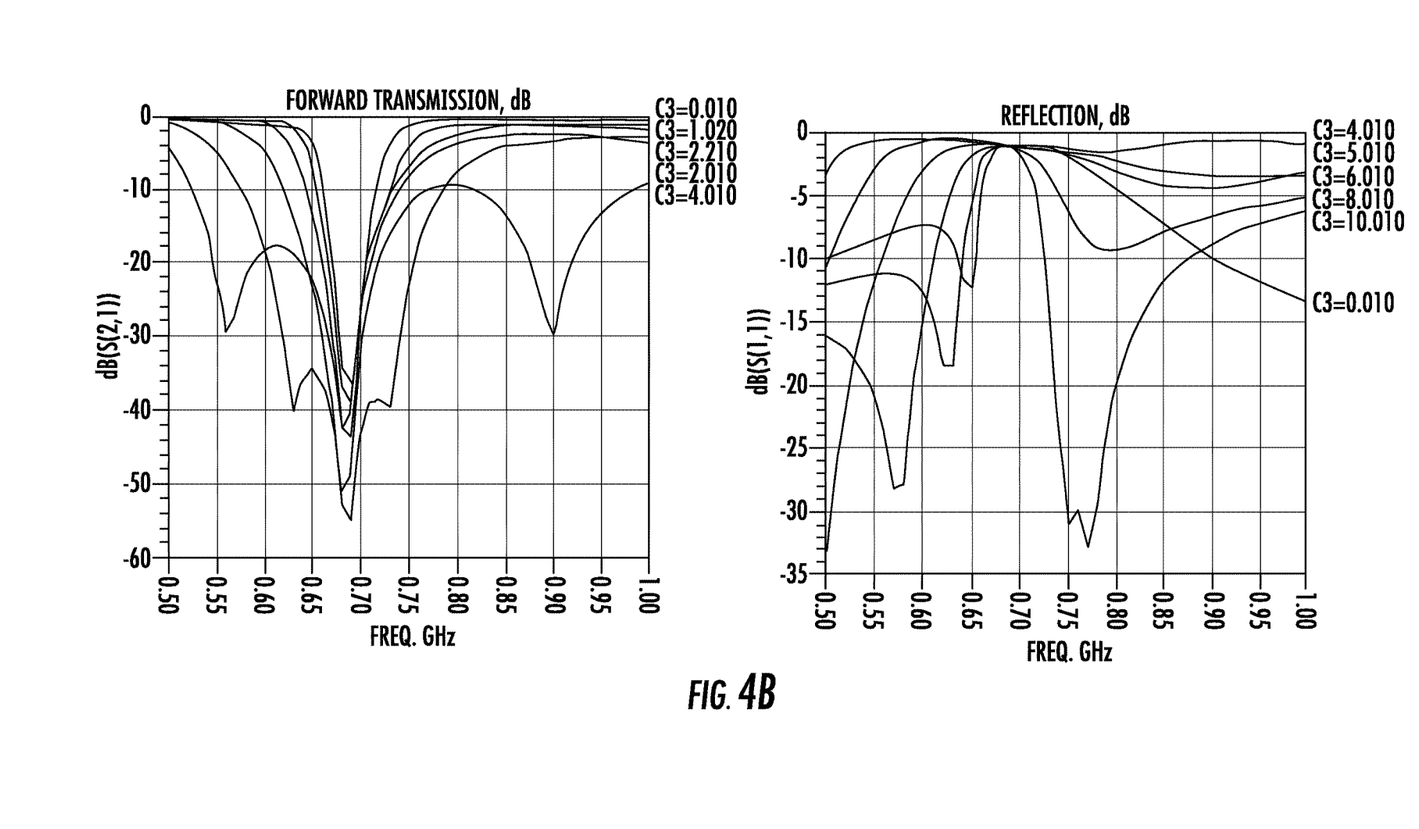
FIG. 4B is a graph showing an example embodiment of pass band tuning for a fixed notch frequency setting.

Such tunable reject band characteristics can be monitored as a change of notch frequency in the S21 transmission characteristics, where tunable pass band characteristics can be seen in the S21 transmission, but tunable passband can more significantly be monitored as moving minimums in the S11 reflection characteristics. As shown in FIG. 4A, for example, it is noted that pass band tuning is noticeable in the reflection response (See, e.g., S11 reflection at bottom of FIG. 4A) compared to forward transmission response (See, e.g., S21 transmission at top of FIG. 4A). Similarly, FIG. 4B illustrates how pass band tuning moves the pass band and matching frequency from left to right as a Impedance value of tunable filter 130 increases and that the pass band moves from one side of the transmission notch to the other side of the transmission notch. In this way, tunable filter 130 can be operable to provide a desired filter response in both "positive" and "negative" duplexing modes. (See, e.g., FIG. 3C)

Figure 5A:
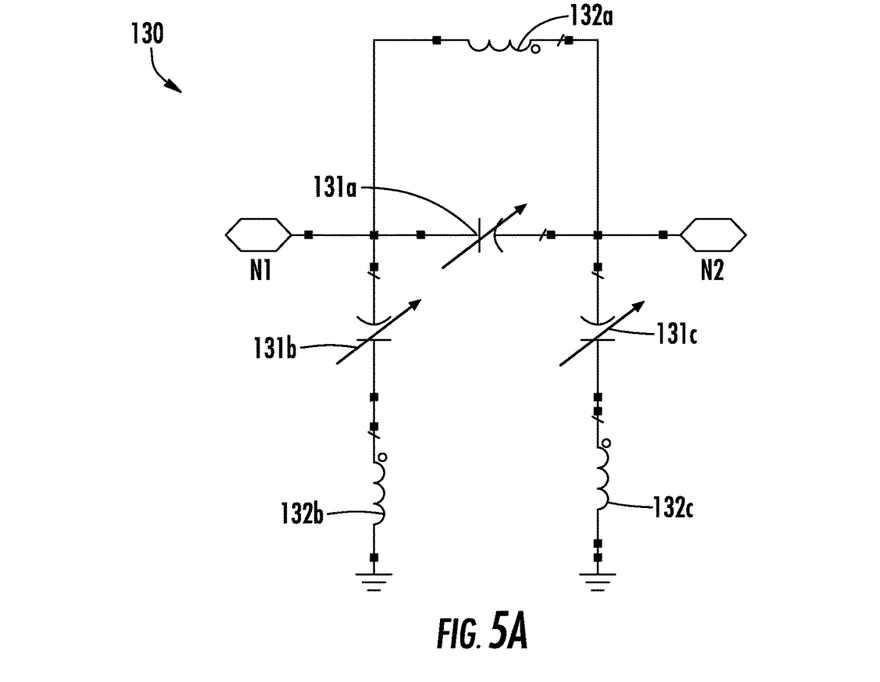
FIGS. 5A through 5D are schematic circuit diagrams of tunable filter configurations of an adaptive filter response system according to embodiments of the present subject matter.
Figure 5B:
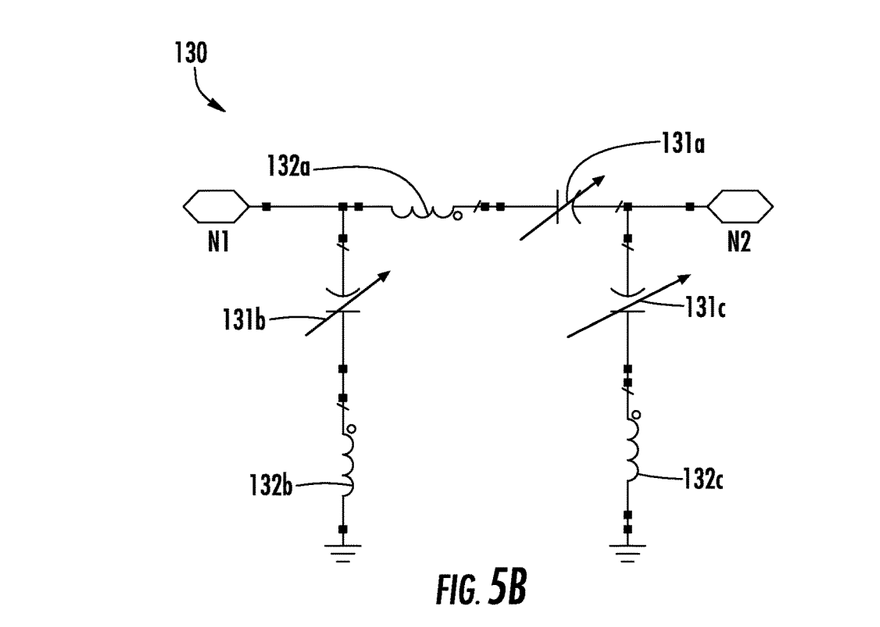
Figure 5C:
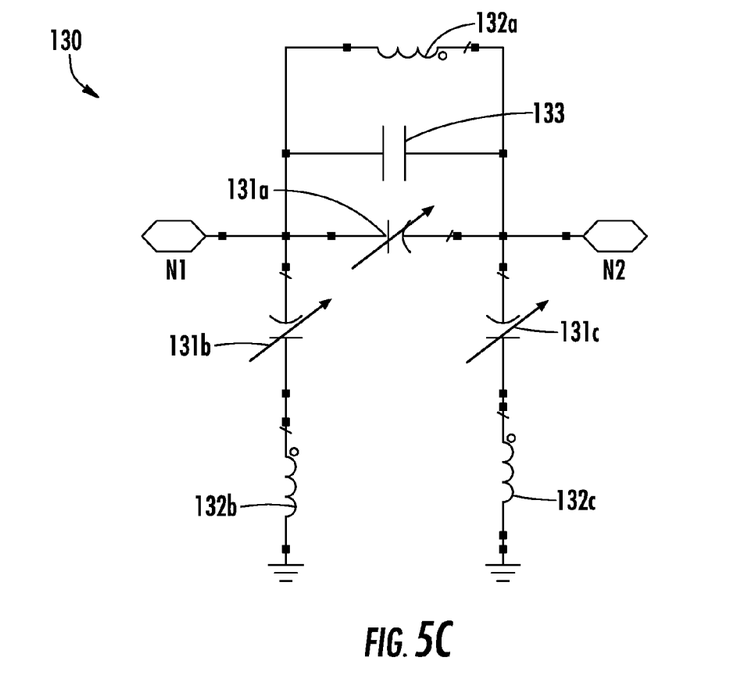
Figure 5D:
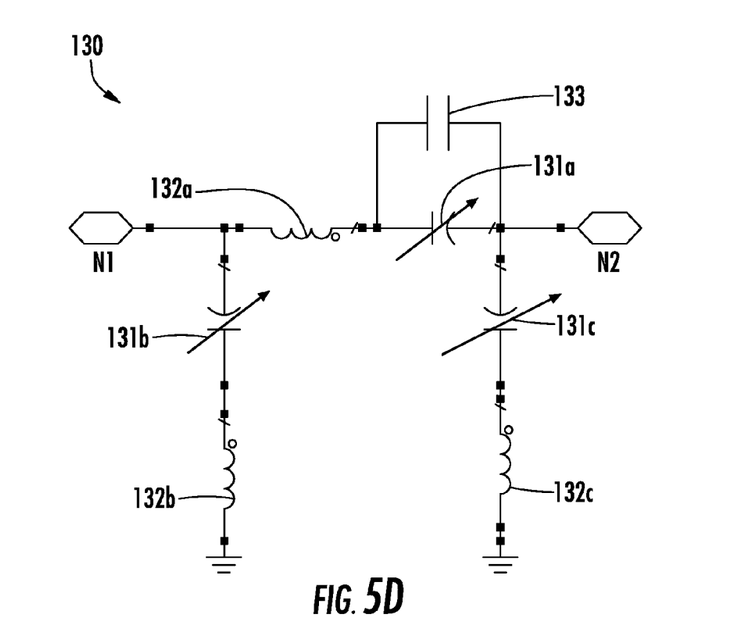

To achieve this tunability, tunable filter 130 can comprise a circuit implementation having the desired programmable response characteristics described above. In particular, for example, FIGS. 5A through 5D provide four exemplary filter configurations that can be advantageously tuned to achieve the desired response. In each configuration, a coupling impedance element is connected in series between an input node N1 and an output node N2 of tunable filter 130. Specifically, in the configuration shown in FIG. 5A, the coupling impedance element comprises a first tunable capacitor 131a and a first inductive element 132a connected in parallel with one another between input node N1 and output node N2. In a similar configuration, FIG. 5C illustrates the coupling impedance element as a first tunable capacitor 131a, a first tunable inductor 132a, and a fixed coupling capacitor 133 all connected in parallel with one another between input node N1 and output node N2. Alternatively, in the configuration illustrated in FIG. 5B, the coupling impedance element can comprise first tunable capacitor 131a being connected in a series configuration with first inductive element 132a between an input node N1 and an output node N2 of tunable filter 130. Finally, FIG. 5D illustrates a similar configuration in which a fixed coupling capacitor 133 is connected in parallel with first tunable capacitor 131a, with this parallel combination of capacitors being provided in a series configuration with first inductive element 132a between an input node N1 and an output node N2.

In any configuration, tunable filter 130 can further comprise a second tunable capacitor 131b and a second inductive element 132b connected in series between input node N1 and a ground (i.e., a first shunt impedance element), and a third tunable capacitor 131c and a third inductive element 132c can be connected in series between output node N2 and ground (i.e., a second shunt impedance element).

In addition, the presently disclosed subject matter can likewise be implemented using further alternative circuit arrangements in which series and shunt components can be tuned in combination to cooperatively define the relative locations of pass- and reject-bands. Specifically, for example, although the configurations shown in FIGS. 5A through 5D each provide a coupling element in series between an input and output and a pair of series resonator tank circuits connected to ground, the adaptive filtering discussed herein can likewise be implemented using parallel tanks in series between the input and output and a coupling element connected in shunt to ground.

Regardless of the particular configuration of tunable filter 130, the filter notch or reject band frequencies can be controlled by tuning the capacitance values of second and third tunable capacitors 131b and 131c (e.g., tunable within a range of between about 0.7 and 1.1 pF). The pass band characteristics can be determined in part by the inductance value of first inductive element 132a (e.g., about 8.2 nH), but the pass band can be further tunable by varying the capacitance value of first tunable capacitor 131a. For example, in the configuration illustrated in FIG. 5A in which first tunable capacitor 131a is arranged in parallel with first inductive element 132a between input node N1 and output node N2, first tunable capacitor 131a can be tunable within a range of between about 2 and 10 pF. In the configuration illustrated in FIG. 5B in which first tunable capacitor 131a is arranged in series with first inductive element 132a between input node N1 and output node N2, first tunable capacitor 131a can be tunable within a narrower range of between about 0.7 and 2.8 pF and still be able to tune the frequency range of the pass band to a range of operating bands. In addition, the combined impedance of the coupling circuit of first tunable capacitor 131a and first inductive element 132a can be controlled such that it can be either inductive (e.g., where $C=C_{min}$) or capacitive (e.g., where $C=C_{max}$) at the desired bands of operation (i.e., at either receive or transmit frequencies). As a result, the pass band and matching can be moved relative to the notch frequency to either side of the notch.

To allow first, second, and third tunable capacitors 131a, 131b, and 131c to be tunable, each element can be implemented using semiconductor technology like complementary metal-oxide-semiconductor (CMOS), Silicon-on-insulator (SOI), pseudomorphic high-electron-mobility transistor (pHEMT), using micro-electro-mechanical systems (MEMS) technology, or using tunable ceramics like Barium Strontium Titanate (BST). Accordingly, varying the respective capacitance states can be accomplished using a respective one of electrical semiconductor switches connected to an array of capacitances, electro-mechanical actuation (e.g., for MEMS), and/or electric field actuation (e.g., for pin diodes or tunable dielectrics like BST). In particular, in configurations where electrical semiconductor switches are used, actuation can be achieved based on voltage field switching (e.g., PHEMT, JFET, CMOS) or current switching (e.g., using bipolar transistors like GaAs HBT). In addition, those having skill in the art will recognize that other implementations are possible in which the tunable filter is configured to selectively tune a frequency of the one or more pass bands by changing an impedance of the one or more coupling impedance element by applying an electric or magnetic field. In the case of electric field actuation, for example, the tunable filter can be configured to effect a dynamic field change during change of filter response, but the electric field can be substantially static during a maintained filter response. In any implementation, first, second, and third tunable capacitors 131a, 131b, and 131c can be configured to be programmable to an integer number of discrete capacitance settings (e.g., in one embodiment according to a binary weighting scheme or in another embodiment according to a linear weighting scheme).

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. An adaptive filter comprising:
    a tunable filter having an input node and an output node, the tunable filter being selectively tunable to define a pass band associated with a first signal band and a reject band associated with a second signal band, wherein the tunable filter is configured to pass signals having frequencies within the first signal band between the input node and the output node, and wherein the tunable filter is configured to block signals having frequencies within the second signal band between the input node and the output node;
    wherein the tunable filter comprises one or more coupling impedance elements, the one or more coupling impedance elements comprising one or more inductors connected in series between the input node and the output node;
    wherein the tunable filter is tunable both to a first mode at which a coupling impedance of the tunable filter between the input node and the output node is tuned such that the pass band has a minimum pass band insertion loss at frequencies that are less than frequencies within the reject band and to a second mode at which the coupling impedance of the tunable filter between the input node and the output node is tuned such that the pass band has a minimum pass band insertion loss at frequencies that are greater than frequencies within the reject band; and wherein the one or more coupling impedance elements are tunable to vary the frequencies at which the minimum pass band insertion loss is achieved within the pass band.

2. The adaptive filter of claim 1, wherein the tunable filter is configured to selectively tune the frequencies of one or both of the pass band or the reject band.

3. The adaptive filter of claim 1, wherein the tunable filter is configured to have a total pass band loss of less than 7 dB and a reject band attenuation of more than 18 dB at corresponding frequencies of the pass band and the reject band, respectively.

4. The adaptive filter of claim 1, wherein the tunable filter comprises:
   at least one first shunt impedance element connected between the input node and a ground; and
   at least one second shunt impedance element connected between the output node and the ground.

5. The adaptive filter of claim 1, wherein the tunable filter is configured to selectively tune a frequency of the pass band by changing an impedance of the one or more coupling impedance elements by applying an electric or magnetic field.

6. The adaptive filter of claim 5, wherein the one or more coupling impedance elements comprises one or more tunable capacitor(s).

7. The adaptive filter of claim 1, wherein the one or more coupling impedance elements comprise:
   one or more capacitors connected in parallel with the one or more inductors between the input node and the output node.

8. The adaptive filter of claim 1, wherein the one or more coupling impedance elements comprise one or more capacitors connected in a series arrangement with the one or more inductors between the input node and the output node.

9. An adaptive filter response system for a wireless radio antenna, the system comprising:
   one or more antennas in communication with a first signal path and a second signal path;
   one or more first tunable filters in communication with the first signal path, the one or more first tunable filters being selectively tunable to define a first pass band associated with a first signal band and a first reject band associated with a second signal band, wherein the one or more first tunable filters is configured to pass signals having frequencies within the first signal band between the one or more antennas and the first signal path, and wherein the one or more first tunable filters is configured to block signals having frequencies within the second signal band between the one or more antennas and the first signal path;
   wherein the one or more first tunable filters comprise one or more coupling impedance elements, the one or more coupling impedance elements comprising one or more inductors connected in series between an input node and an output node in the first signal path;
   wherein the one or more first tunable filters is selectively tunable both to a first mode at which a coupling impedance of the tunable filter between the one or more antennas and the first signal path is tuned such that the frequencies passed by the first pass band are less than frequencies within the first reject band and to a second mode at which the coupling impedance of the tunable filter between the one or more antennas and the first signal path is tuned such that the frequencies passed by the pass band are greater than frequencies within the reject band;

wherein the one or more coupling impedance elements are tunable to vary a frequency at which a minimum pass band insertion loss is achieved within the first pass band.

10. The system of claim 9, wherein each of the one or more first tunable filters comprises:
    at least one first shunt impedance element connected between the input node and a ground; and
    at least one second shunt impedance element connected between the output node and the ground.

11. The system of claim 9, wherein the one or more first tunable filters is configured to selectively tune the frequencies of one or both of the first pass band or the first reject band.

12. The system of claim 9, comprising one or more second tunable filters in communication with the second signal path, the one or more second tunable filters being selectively tunable to define a second pass band associated with the second signal band and a second reject band associated with the first signal band, wherein the one or more second tunable filters is configured to pass signals having frequencies within the second signal band between the one or more antennas and the second signal path, and wherein the one or more second tunable filters is configured to block signals having frequencies within the first signal band.

13. The system of claim 12, wherein the one or more second tunable filters is configured to selectively tune the frequencies of one or both of the second pass band or the second reject band.

14. The system of claim 9, comprising a control unit in communication with the one or more first tunable filters.

15. The system of claim 9, comprising a remote wireless communication unit having a fixed-location antenna in communication with the one or more antennas, the remote wireless communication unit being configured to serve one or more users or devices within an area.

16. A method for tuning an adaptive filter response system, the method comprising:
    connecting a tunable filter between an input node and an output node, wherein the tunable filter comprises one or more coupling impedance elements, the one or more coupling impedance elements comprising one or more inductors connected in series between the input node and the output node;
    defining a pass band associated with a first signal band and a reject band associated with a second signal band, wherein signals having frequencies within the first signal band are passed between the input node and the output node, and wherein signals having frequencies within the second signal band are blocked between the input node and the output node; and
    selectively tuning the tunable filter among a first mode at which a coupling impedance of the tunable filter between the input node and the output node is tuned such that the pass band has a minimum pass band insertion loss at frequencies that are less than frequencies within the reject band and a second mode at which the coupling impedance of the tunable filter between the input node and the output node is tuned such that the pass band has a minimum pass band insertion loss at frequencies that are greater than frequencies within the reject band;

wherein selectively tuning the tunable filter comprises tuning the one or more coupling impedance elements to vary the frequencies at which the minimum pass band insertion loss is achieved within the pass band.

17. The method of claim 16, wherein selectively tuning the pass band to have the minimum pass band insertion loss at the frequencies thereof comprises changing an impedance of the one or more coupling impedance elements.

18. The method of claim 16, wherein selectively tuning the pass band to have the minimum pass band insertion loss at the frequencies thereof comprises:
   scanning for high power broadcast channels, frequencies, or frequency bands; and
   tuning the pass band according to the channel, frequency, or frequency band being scanned for power.

19. The method of claim 16, wherein selectively tuning the pass band to have the minimum pass band insertion loss at the frequencies thereof comprises:
   establishing a downlink to a remote wireless communication unit; and
   tuning the pass band according to a band or physical frequency channel assigned for receive or transmit by the remote wireless communication unit.

20. The method of claim 16, comprising selectively tuning the frequencies of one or both of the pass band or the reject band.

* * * * *